US006653702B2

(12) United States Patent
Ishio et al.

(10) Patent No.: US 6,653,702 B2
(45) Date of Patent: Nov. 25, 2003

(54) SEMICONDUCTOR PRESSURE SENSOR HAVING STRAIN GAUGE AND CIRCUIT PORTION ON SEMICONDUCTOR SUBSTRATE

(75) Inventors: Seiichiro Ishio, Kariya (JP); Inao Toyoda, Okazaki (JP); Kazuaki Hamamoto, Nagoya (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/866,752

(22) Filed: May 30, 2001

(65) Prior Publication Data
US 2001/0052628 A1 Dec. 20, 2001

(30) Foreign Application Priority Data
Jun. 13, 2000 (JP) .......................... 2000-176961
Feb. 16, 2001 (JP) .......................... 2001-040498

(51) Int. Cl.[7] .............................................. H01L 29/82
(52) U.S. Cl. .................. 257/419; 257/415; 257/417; 257/418; 257/419; 257/420; 438/50; 438/51; 438/52; 438/53
(58) Field of Search .................... 257/419, 417, 257/418, 420, 415; 438/50, 51, 52, 53

(56) References Cited

U.S. PATENT DOCUMENTS

| 3,893,228 A | * | 7/1975 | George et al. ............. 29/580 |
| 3,994,009 A | * | 11/1976 | Hartlaub ..................... 29/84 |
| 4,003,127 A | * | 1/1977 | Jaffe et al. ................. 29/580 |
| 4,415,948 A | * | 11/1983 | Grantham et al. ......... 361/283 |
| 4,426,768 A | * | 1/1984 | Black et al. ................ 29/583 |
| 4,885,621 A | * | 12/1989 | Yoder et al. ............... 357/26 |
| 4,975,390 A | * | 12/1990 | Fujii et al. ................ 437/228 |
| 5,242,863 A | * | 9/1993 | Xiang-Zheng et al. ...... 437/228 |
| 5,289,721 A | | 3/1994 | Tanizawa et al. |
| 5,654,244 A | | 8/1997 | Sakai et al. |
| 5,677,560 A | * | 10/1997 | Zimmer et al. ............. 257/418 |
| 5,877,039 A | | 3/1999 | Tanizawa |
| 5,914,520 A | | 6/1999 | Werner |
| 5,932,921 A | * | 8/1999 | Sakai et al. ................. 257/419 |
| 6,278,167 B1 | * | 8/2001 | Bever et al. ................ 257/415 |
| 6,417,021 B1 | * | 7/2002 | Vigna et al. ................. 438/53 |

FOREIGN PATENT DOCUMENTS

| JP | A-55-68679 | 5/1980 |
| JP | A-2-34973 | 2/1990 |
| JP | A-2-240971 | 9/1990 |
| JP | A-4-103177 | 4/1992 |
| JP | A-7-22629 | 1/1995 |
| JP | A-7-153974 | 6/1995 |
| JP | A-8-116069 | 5/1996 |
| JP | A-8-236788 | 9/1996 |
| JP | A-11-14482 | 1/1999 |
| JP | A-2000-133817 | 5/2000 |

OTHER PUBLICATIONS

Tetsuo, F. et al., "Fabrication of Microdiaphragm Pressure Sensor Utilizing Micromachining" in: *Sensors and Actuators A.34* (1992), pp. 217–224.

Scott, G. et al. "NMOS Drive Current Reduction Caused by Transistor Layout and Trench Isolation Induced Stress" in: *IEEE IEDM* (1999), pp. 827–830.

* cited by examiner

*Primary Examiner*—Eddie Lee
*Assistant Examiner*—Edgardo Ortiz
(74) *Attorney, Agent, or Firm*—Posz & Bethards, PLC

(57) ABSTRACT

A semiconductor pressure sensor includes a SOI substrate composed of first and second silicon substrates. A diaphragm portion is formed by the first silicon substrate as a bottom of a recess portion formed in the second silicon substrate. Strain gauges are formed on the diaphragm portion, and a circuit portion is formed on the first silicon substrate at a region other than the diaphragm portion. A LOCOS film for isolating the strain gauges from the circuit portion is formed on the first silicon substrate outside the outermost peripheral portion of the diaphragm portion.

2 Claims, 9 Drawing Sheets

SEMICONDUCTOR PRESSURE SENSOR HAVING STRAIN GAUGE AND CIRCUIT PORTION ON SEMICONDUCTOR SUBSTRATE

CROSS REFERENCE TO THE RELATED APPLICATIONS

This application is based upon and claims the benefit of priority of the prior Japanese Patent Applications No. 2000-176961 filed on Jun. 13, 2000, and No. 2001-40498 filed on Feb. 16, 2001, the contents of which are incorporated herein by reference.

BACKGROUND OF THE INVENTION

1. Field of the Invention

The present invention relates to a semiconductor pressure sensor having a diaphragm portion that is deformed due to applied pressure, strain gauges for generating electric signals in accordance with deformation of the diaphragm portion, and a circuit portion for detecting the electric signals from the strain gauges, which are formed on a semiconductor substrate composed of a first silicon substrate and a second silicon substrate with an insulation film interposed therebetween.

2. Description of the Related Art

In such a semiconductor pressure sensor, a diaphragm portion for detecting pressure and a circuit portion are integrated on a single semiconductor chip (semiconductor substrate). Conventionally, analog circuit elements such as bipolar transistors are mainly used as circuit elements that are integrated. On the other hand, there is a request of integrating analog circuits and digital circuits in accordance with the recent improvement of LSI processing and LSI devising technologies.

In such a situation, JP-A-4-103177 discloses a semiconductor pressure sensor in which a diaphragm portion, digital circuit elements and analog circuit elements can be integrated on a single semiconductor chip. In this semiconductor pressure sensor, the digital circuit elements such as CMOS (Complementary MOS) circuits are electrically isolated from each other through a LOCOS (Local Oxidation of Silicon) film on a silicon substrate, i.e., a SOI (Silicon On Insulator) wafer where the diaphragm portion is formed.

However, when the LOCOS film for isolating the digital circuit elements is formed on a thin-wall portion of the diaphragm portion, since the LOCOS film is thick, strain characteristics of the diaphragm portion, that is, sensor characteristics is adversely affected by the LOCOS film. Further, it is required to improve the withstand voltage property between the circuit elements to realize higher integration of the circuit elements.

On the other hand, recently, such a semiconductor pressure sensor has been used for various applications. For example, such a semiconductor pressure sensor has been used as an intake pressure sensor in a vehicle engine intake system or the like, which is liable to be disclosed to contaminants in a severe environment. Therefore, since it is feared that sensor characteristics are deteriorated due to contaminant adhesion to the sensor, environment resistance is required to be further improved.

SUMMARY OF THE INVENTION

In view of the foregoing problems, an object of the present invention is to restrict a LOCOS film from adversely affecting sensor characteristics in a semiconductor pressure sensor having a diaphragm portion for detecting a pressure. Another object of the invention is to improve sensor characteristics of a semiconductor pressure sensor including circuit elements isolated from each other by a LOCOS film.

According to the present invention, a semiconductor pressure sensor includes a first silicon substrate, a second silicon substrate, and an insulation film interposed between the first and second silicon substrates. The second silicon substrate has a recess portion, and a diaphragm portion is formed by the first silicon substrate as a bottom of the recess portion. A strain gauge is formed on the diaphragm portion, and a circuit portion for detecting an electric signal from the strain gauge is formed on the first silicon substrate at a portion other than the diaphragm portion. Further, a LOCOS film for electrically isolating the strain gauge from the circuit portion is formed on a main surface of the first silicon substrate. The LOCOS film is located outside an outermost peripheral portion of a thin-wall portion of the diaphragm portion.

Preferably, the circuit portion includes a plurality of circuit elements isolated from each other by a trench that penetrates the first silicon substrate in a thickness direction to reach the insulation film. A plurality of trenches may be provided in the first semiconductor substrate for isolating the circuit elements. In this case, the strain gauge should define a distance of 50 um or more from any one of the trenches on the main surface of the first silicon substrate.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF PREFERRED EMBODIMENT

Figure 1:
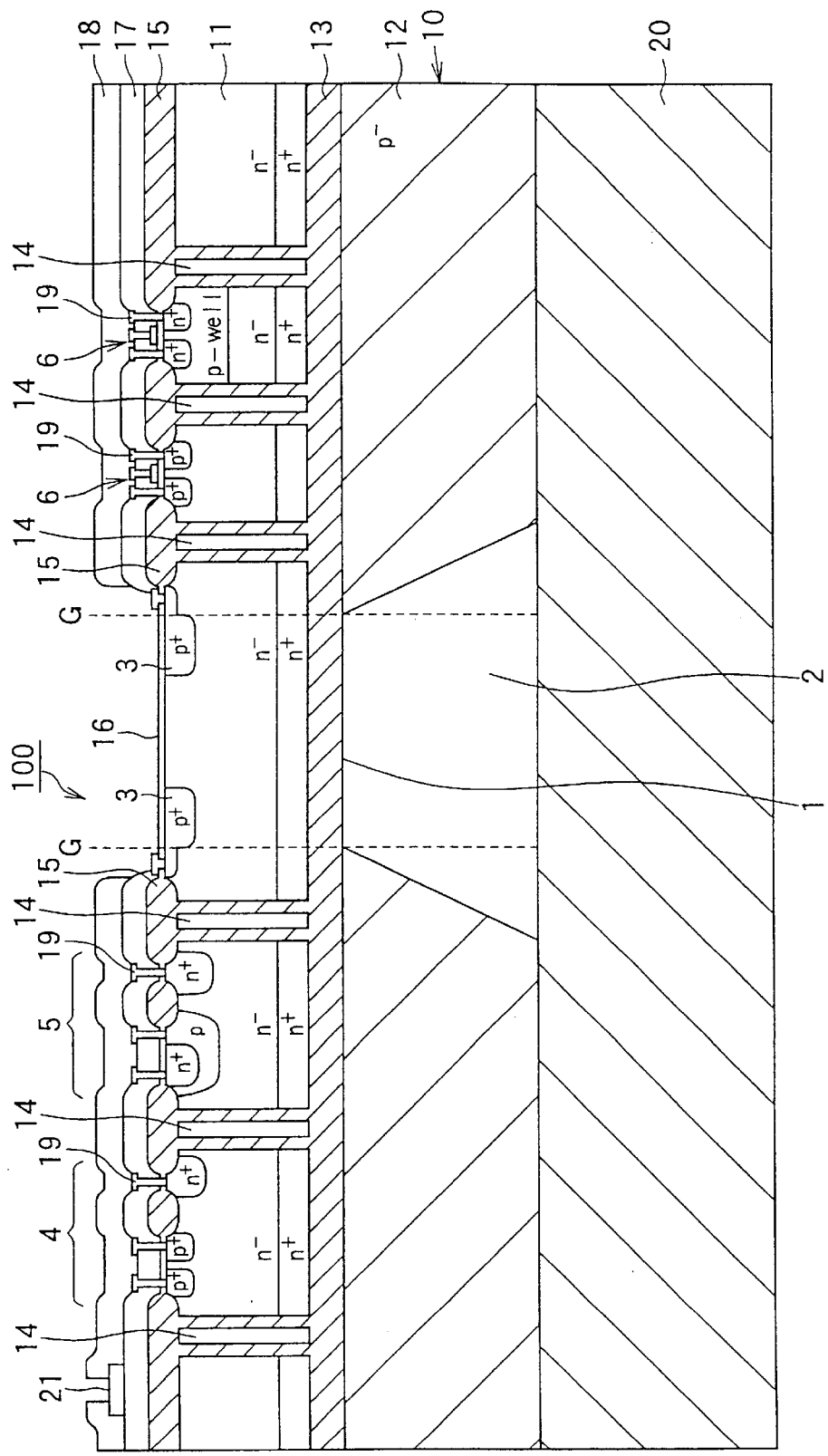
FIG. 1 is a schematic sectional view showing a semiconductor pressure sensor according to a first preferred embodiment of the present invention.

A first preferred embodiment of the present invention will be explained with reference to FIGS. 1 to 6B. AS shown in FIG. 1, a semiconductor substrate 10 formed with a diaphragm portion 1 for detecting pressure is bonded to a glass substrate (glass base) 20 to form a semiconductor pressure sensor 100.

The semiconductor substrate 10 is a SOI (Silicon On Insulator) substrate formed by laminating a first silicon substrate 11 and a second silicon substrate 12 through an embedded oxide film (insulation film) 13 interposed between the first and second silicon substrates 11, 12. Each main surface of the first and second silicon substrates 11, 12 has a (100) plane. In FIG. 1, "$n^+$", "$n^-$", "$p^+$" and "$p^-$" indicate a high concentration n layer, a low concentration n layer, a high concentration p layer and a low concentration p layer, respectively.

A recess portion 2 is provided on the main surface of the semiconductor substrate 10 at a side of the second silicon substrate 12, and the diaphragm portion 1 is formed by the first silicon substrate 11 facing the recess portion 2. The glass substrate 20 is bonded to the main surface of the second silicon substrate 12 by anodic bonding so as to seal the recess portion 2 in vacuum.

In the first embodiment, the second silicon substrate 12 is entirely removed in the thickness direction to provide the recess portion 2, so that the first silicon substrate 11 and the embedded oxide film 13 remain corresponding to the recess portion 2, and form the diaphragm portion 1. However, the embedded oxide film 13 may also be entirely removed in the thickness direction so that the diaphragm portion 1 can be composed only of the first silicon substrate 11. Otherwise, the second silicon substrate 12 may not be entirely removed in the thickness direction so that the diaphragm portion 1 can be composed of the first silicon substrate 11, the embedded oxide film 13 and the partially remaining second silicon substrate 12.

Strain gauges (gauge diffused resistors) 3 for generating electric signals in accordance with deformation of the diaphragm portion 1 are formed on the diaphragm portion 1 of the first silicon substrate 11 so as to form a Wheatstone bridge circuit. A circuit portion for detecting the electric signals from the strain gauges is formed on the first silicon substrate 11 at a portion other than the diaphragm portion 1.

The circuit portion is composed of plural circuit elements 4 to 6, and constitutes BiCMOS including a bipolar circuit and a CMOS (Complementary MOS) circuit that are integrated together. The bipolar circuit, which is an analog circuit portion composed of a PNP bipolar transistor 4 and an NPN bipolar transistor 5, amplifies the signals from the strain gauges 3 and constitutes an electric source. The CMOS circuit, which is a digital circuit portion composed of a MOS transistor 6, determines data and adjusts the signals.

Trenches 14, which penetrate the first silicon substrate 11 from the main surface thereof in the thickness direction to reach the embedded oxide film (insulation film) 13, are respectively provided between the circuit elements 4 to 6. The circuit elements 4 to 6 are isolated from each other by the trenches 14. An oxide film is formed on each sidewall of the trenches 14, and polysilicon is embedded within the trenches 14, thereby ensuring the electrical insulation performance.

A LOCOS (Local Oxidation of Silicon) film 15 is formed on the main surface of the first silicon substrate 11 to electrically isolate the circuit elements 4 to 6. The strain gauges 3 and the circuit portion are electrically isolated from each other by the LOCOS film 15. As shown in FIG. 1, the LOCOS film 15 is formed outside an outermost peripheral portion of a thin-wall portion of the diaphragm portion 1. The outermost peripheral portion is indicated with broken lines G in FIG. 1. Thus, an edge of the LOCOS film 15 is separated from the outermost peripheral portion of the thin-wall portion of the diaphragm portion 1.

A PSG (Phosphor-Silicate Glass) film 16 is formed on the main surface of the first silicon substrate 11 at the diaphragm portion 1 to protect the diaphragm portion 1 and the strain gauges 3. A $SiO_2$ film 17 as an intermediate insulation film and a SiN system insulation film (including Si and N as main components) 18 as a protective film are successively formed on the main surface of the first silicon substrate 11 at portions other than the diaphragm portion 1, thereby protecting the circuit portion.

Wiring members 19 made of aluminum (Al) or the like are formed on the strain gauges and the circuit elements 4 to 6, and are electrically connected to pads 21 which are also made of aluminum (Al) or the like and are exposed from the SiN system insulation film 18. The pads 21 can be electrically connected to the outside by wire bonding or the like.

Figure 2A:
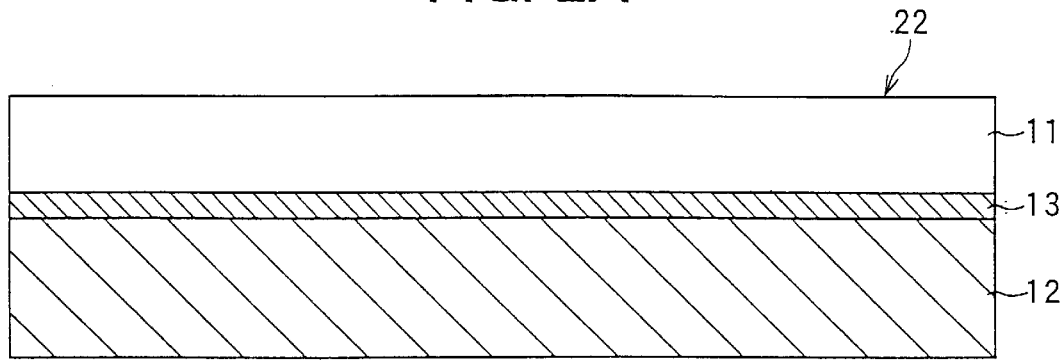
FIGS. 2A to 2C are cross-sectional views showing manufacturing steps of the semiconductor pressure sensor shown in FIG. 1.
Figure 2B:
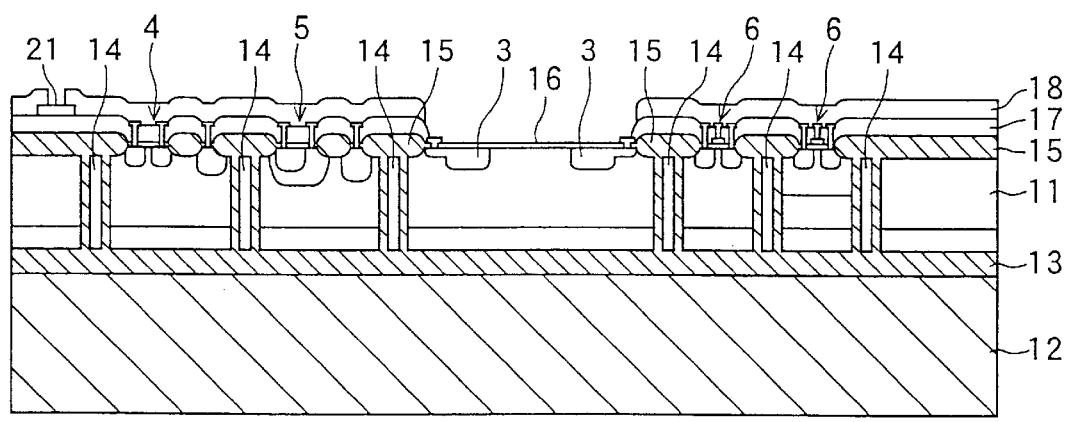

Next, a manufacturing method of the sensor 100 will be described with reference to FIGS. 2A to 2C. The semiconductor substrate 10 is composed of a SOI wafer 22 shown in FIG. 2A. First, the trenches 14 are formed from the main surface of the first silicon substrate 11 by dry etching or the like, and the sidewalls of each trench 14 are oxidized by heat treatment or the like. Then, polysilicon is embedded within each trench 14.

Next, the LOCOS film 15 is formed on the first silicon substrate 11 at regions isolated by the trenches 14, by using a well-known semiconductor process technique. Then, the plural circuit elements 4 to 6 and the strain gauges, isolated from each other by the LOCOS film 15, are formed by diffusion of p layers and n layers. Further, the wiring members 19 of aluminum or the like and films 17, 18 for protection are formed on the first silicon substrate 11. Thus, as shown in FIG. 2B, various surface circuit elements are formed on the first silicon substrate 11.

Figure 2C:
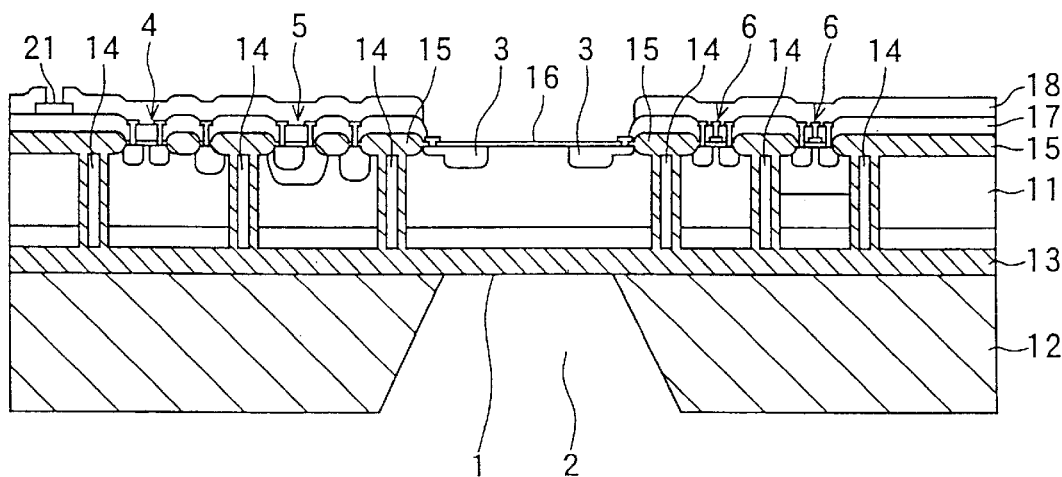

Next, as shown in FIG. 2C, the second silicon substrate 12 of the SOI wafer 22 is etched by anisotropic etching in an aqueous solution of KOH or the like from the main surface of the second silicon substrate 12, so that the recess portion 2 and the diaphragm portion 1 are formed. Then, the glass substrate 20 is bonded to the main surface of the second silicon substrate 12 by anodic bonding in vacuum, and both the substrates 10, 20 bonded to each other are cut into semiconductor chips by dicing. One of the semiconductor chips is completed as the sensor 100 shown in FIG. 1.

When pressure is applied to this semiconductor pressure sensor 100 from the main surface of the first silicon substrate 11, the diaphragm portion 1 is deformed, and the resistance values of the strain gauges change in accordance with the deformation of the diaphragm portion 1. Thereby a voltage value of the Wheatstone bridge circuit described above is changed, and the changed voltage value is detected as an electric signal at the circuit portion, so that the applied pressure is detected.

According to the first embodiment, the LOCOS film 15 is formed on the first silicon substrate 11 of the semiconductor substrate 10. Thus, isolation is performed between the circuit elements 4 to 6 and between the circuit portion and the strain gauges 3 through the LOCOS film 15, thereby realizing the sensor in which the diaphragm portion 1, the digital circuit elements 6 and the analog circuit elements 4, 5 are integrated on a single semiconductor chip.

Further, the trenches 14, which penetrate the first silicon substrate 11 in the thickness direction to reach the embedded oxide film (insulation film) 13, are provided in the first embodiment, and the plural circuit elements 4 to 6 constituting the circuit portion are electrically isolated from each other by the trenches 14. Therefore, the withstand voltage can be further increased between the circuit elements 4 to 6, and integration can be further progressed in this sensor 100.

Furthermore, in the first embodiment, the LOCOS film 15 is formed on the main surface of the semiconductor substrate 10 at the side of the first silicon substrate 11 so as to be positioned outside the outermost peripheral portion of the thin-wall portion of the diaphragm portion 1. Therefore, since the LOCOS film 15 is not located on the diaphragm portion 1, strain characteristics of the diaphragm portion 1, that is, sensor characteristics can be restricted from being adversely affected by the LOCOS film 15.

Figure 3:
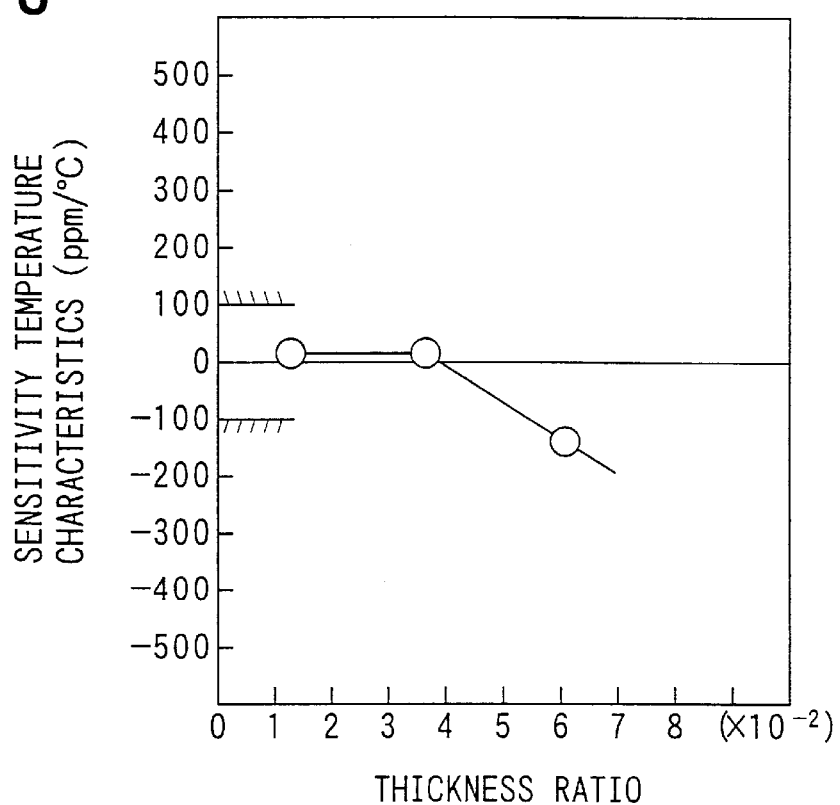
FIG. 3 is a graph showing effects of a LOCOS film to sensor characteristics.

Next, the adverse effect of the LOCOS film 15 to the sensor characteristics was studied, and an example of the studies is shown in FIG. 3. FIG. 3 shows temperature characteristics (ppm/° C.) of the sensor sensitivity (sensitivity temperature characteristics) relative to thickness ratio of a thermal oxidation film to the diaphragm in a case where the thermal oxidation film is formed on the main surface of the silicon substrate 11 having the diaphragm thickness (thickness of the first silicon substrate 11 at the diaphragm portion 1) of ten and several $\mu$m.

As the sensitivity temperature characteristics approach zero, temperature dependency of the sensitivity becomes smaller and becomes more preferable. In actual usage, the sensitivity temperature characteristics are required to fall in a range of +100 ppm/° C. to –100 ppm/° C. Since allowable thickness of the thermal oxidation film is within about 30 nm as shown in FIG. 3, the sensitivity temperature characteristics are degraded if the LOCOS film having thick thickness of about 1–2 $\mu$m is provided.

In this respect, since the LOCOS film 15 is not located on the diaphragm portion 1 in the first embodiment, the sensor characteristics can be restricted from being adversely affected by the LOCOS film 15. Although the PSG film 16 is formed on the surface of the diaphragm portion 1 in the first embodiment, since the PSG film 16 is thin, the PSG film 16 hardly adversely affects the sensor characteristics.

As in such manners according to the first embodiment, the following effects can be obtained in the semiconductor pressure sensor 100 in which the diaphragm portion 1, the digital circuit elements 6 and the analog circuit elements 4, 5 are integrated on a single semiconductor chip. That is, the sensor characteristics can be restricted from being adversely affected by the LOCOS film 15 for electrically insolating the digital circuit elements 6, and simultaneously, the withstand voltage can be improved between the circuit elements.

Since the main surface of the second silicon substrate 12 of the semiconductor substrate 10 has the (100) plane, the diaphragm portion 1, formed by the above-described anisotropic etching, generally has a quadrangle plane shape. However, it is preferable that the plane shape of the diaphragm portion 1 is a polygon including five corners or more. Thereby, the plane shape of the diaphragm portion 1 further approaches a circle, so that stress distribution can be made uniform on a surface of the diaphragm portion 1.

Figure 4:
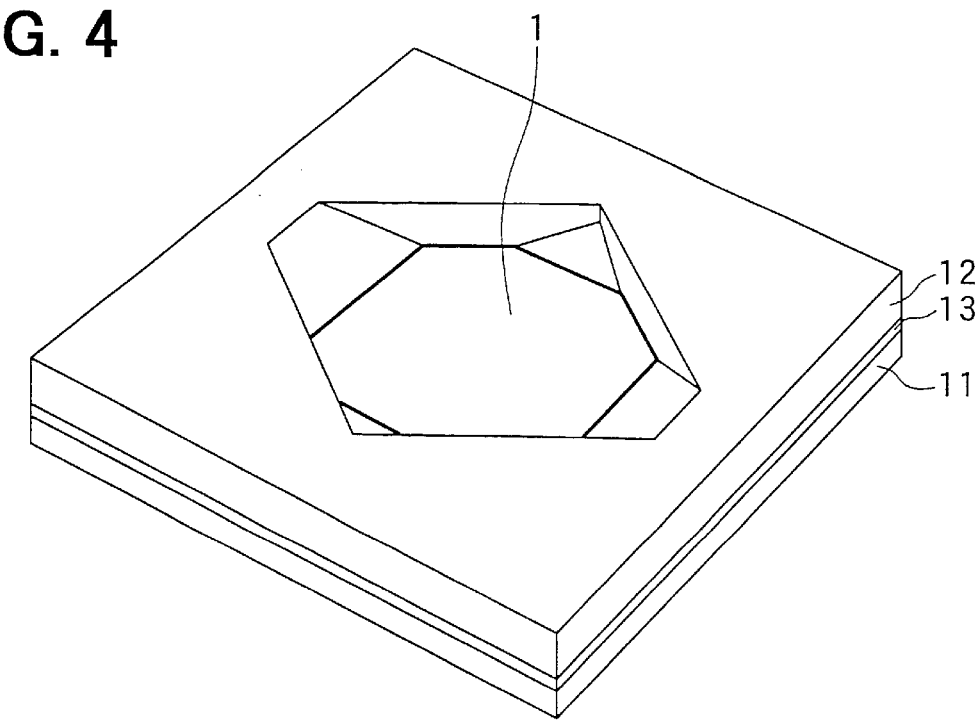
FIG. 4 is a perspective view showing a diaphragm portion whose plane shape is an octagon.

The diaphragm portion 1, whose plane shape is a polygon including five corners or more, can be formed by using the second silicon substrate 12 with the main surface other than a (100) plane, by devising a mask pattern for anisotropic etching, or other manners. For example, as shown in FIG. 4, the diaphragm portion 1, whose plane shape is an octagon, can be easily formed in the above-described anisotropic etching by using the second silicon substrate 12 having a (110) plane on the main surface.

Figure 5A:
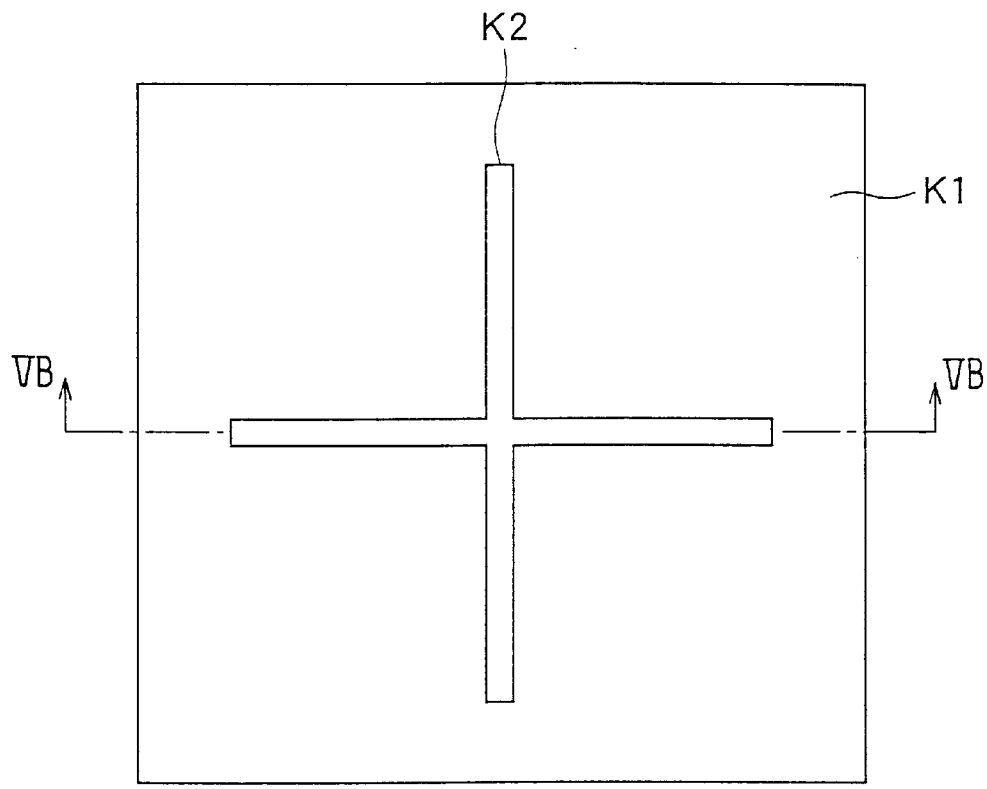
FIG. 5A is a plan view showing a mask pattern for forming a diaphragm portion whose plane shape is a dodecagon.
Figure 5B:
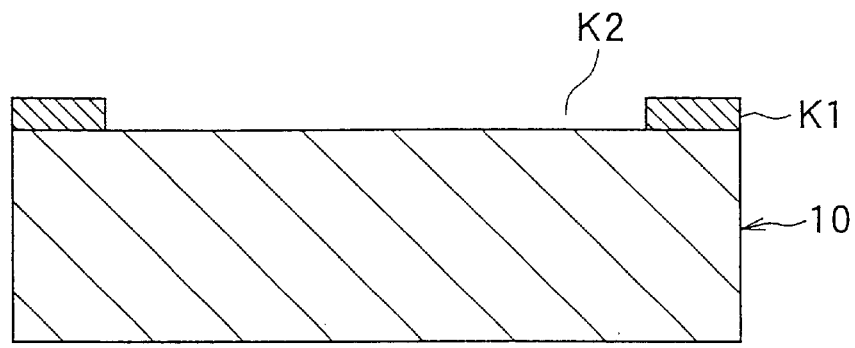
FIG. 5B is a cross-sectional view taken along line VB—VB in FIG. 5A.
Figure 6A:
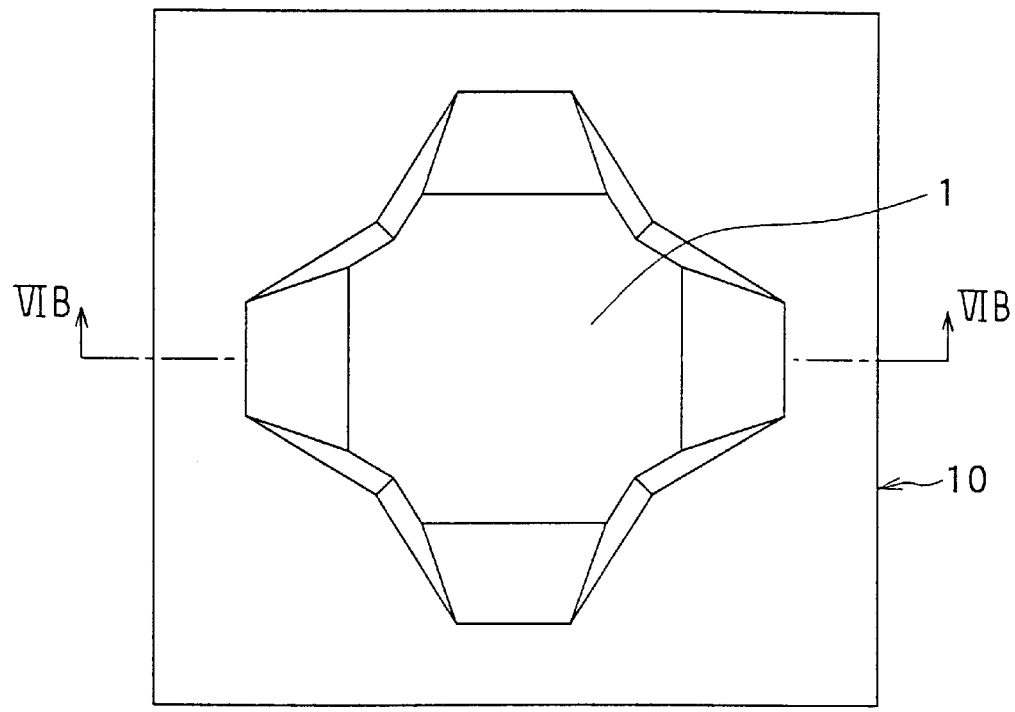
FIG. 6A is a plan view showing a diaphragm portion whose plane shape is a dodecagon.
Figure 6B:
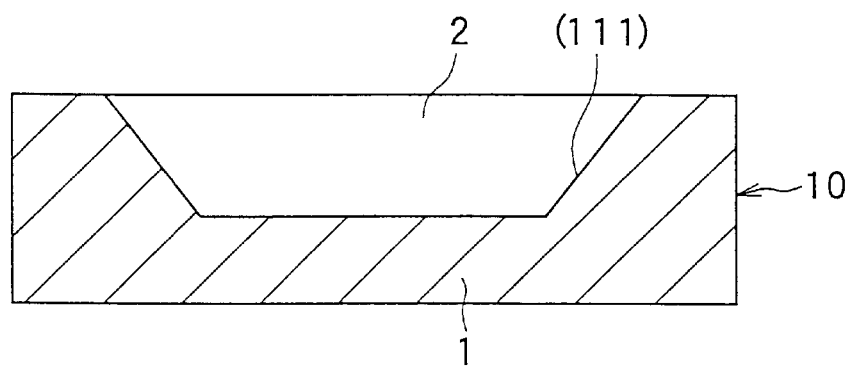
FIG. 6B is a cross-sectional view taken along line VIB—VIB in FIG. 6A.

When the main surface of the second silicon substrate 12 has a (100) plane, a mask K1 shown in FIGS. 5A and 5B can be adopted. The mask is made of a silicon nitride film or the like and is formed with an opening portion K2 having a cross shape, by plasma enhanced CVD. Then, for example, the diaphragm portion 1, whose plane shape has a dodecagon as shown in FIGS. 6A and 6B, can be formed by anisotropic etching in an aqueous solution of KOH as described in JP-A-2-34973.

Second Embodiment

Figure 7:
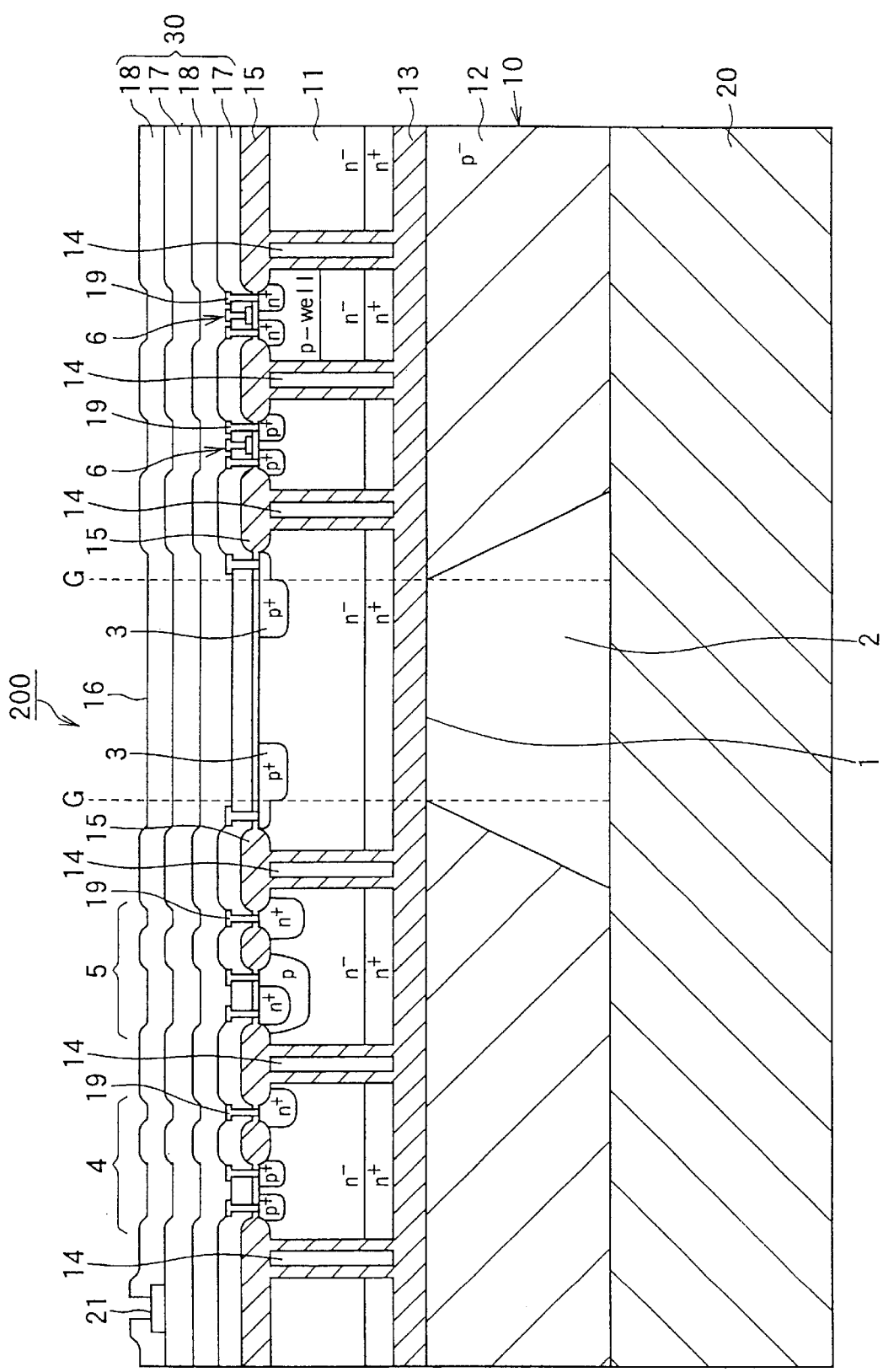
FIG. 7 is a cross-sectional view showing a semiconductor pressure sensor according to a second preferred embodiment of the present invention.

The main object of the second embodiment is to improve an environment resistance in a semiconductor pressure sensor 200 in which a diaphragm portion, digital circuit elements and analog circuit elements are integrated on a single semiconductor chip. For example, the semiconductor pressure sensor 200 according to the second embodiment can be preferably used as a vehicle intake-pressure sensor or the like, which is liable to be disclosed to contaminants in a severe environment. Hereinafter, the second embodiment will be described with reference to FIG. 7 mainly on points different from the first embodiment.

The semiconductor pressure sensor 200 according to the second embodiment is mainly characterized in as follows. That is, the diaphragm portion 1 and the circuit portion are coated and protected by a protection film 30 formed on the main surface of the semiconductor substrate 10 at the side of the first silicon substrate 11. Further, the protection film 30 includes at least two SiN system insulation films 18.

In the semiconductor pressure sensor 100 according to the first embodiment, the lamination film of the SiO$_2$ film 17 and the SiN system insulation film 18 is not formed on the diaphragm portion 1. However, in the semiconductor pressure sensor 200 according to the second embodiment, as in an example shown in FIG. 7, the same lamination film as in the first embodiment is formed on the diaphragm portion 1, and the same lamination film is further formed thereon.

Thus, the protection film 30 including two SiN system insulation films 18 covers almost all area of the main surface of the first silicon substrate 11 through the SiO$_2$ films 17 as intermediate insulation films. Here, for example, the thickness of the lower side SiN system insulation film 18 is 0.5 $\mu$m, and the thickness of the upper side SiN system insulation film 18 is 0.8–1.6 $\mu$m.

In such a semiconductor pressure sensor, because alkali metal ions, which may deteriorate the elements, cannot easily pass through the SiN system insulation film 18, the SiN system insulation film 18 is suitable for a protection film. When the protection film 30 including at least two SiN system insulation films 18 is formed, even if photoetching defects and pinholes are produced on one of the SiN system insulation films 18, another film can compensate for the photoetching defects and the pinholes. As a result, the environment resistance can be improved.

Third Embodiment

Figure 8:
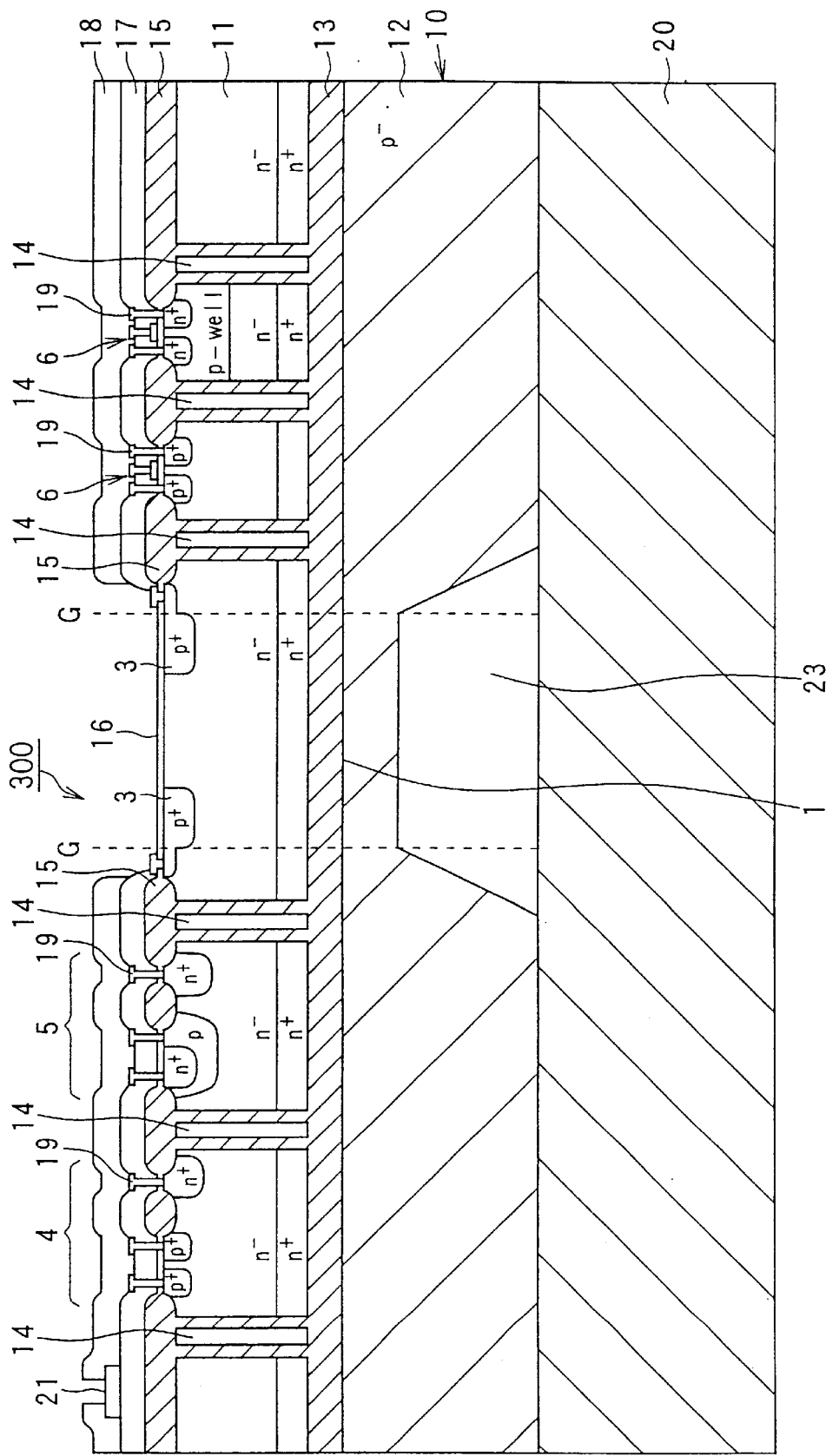
FIG. 8 is a cross-sectional view showing a semiconductor pressure sensor according to a third preferred embodiment of the present invention.

As shown in FIG. 8, a semiconductor pressure sensor 300 according to a third embodiment has substantially the same structure as that shown in FIG. 1 excepting the recess portion 2 provided in the second silicon substrate 12. A recess portion 23 shown in FIG. 8 is provided so as not to reach the embedded oxide film 13. In the third embodiment, the same operational effects as those in the first embodiment can be also obtained.

In the above-described embodiments, it is feared that the strain gauges 3 are adversely affected by stress of the trenches 14. Therefore, it is preferable that the trenches are provided outside the periphery of the diaphragm portion 1.

Figure 9A:
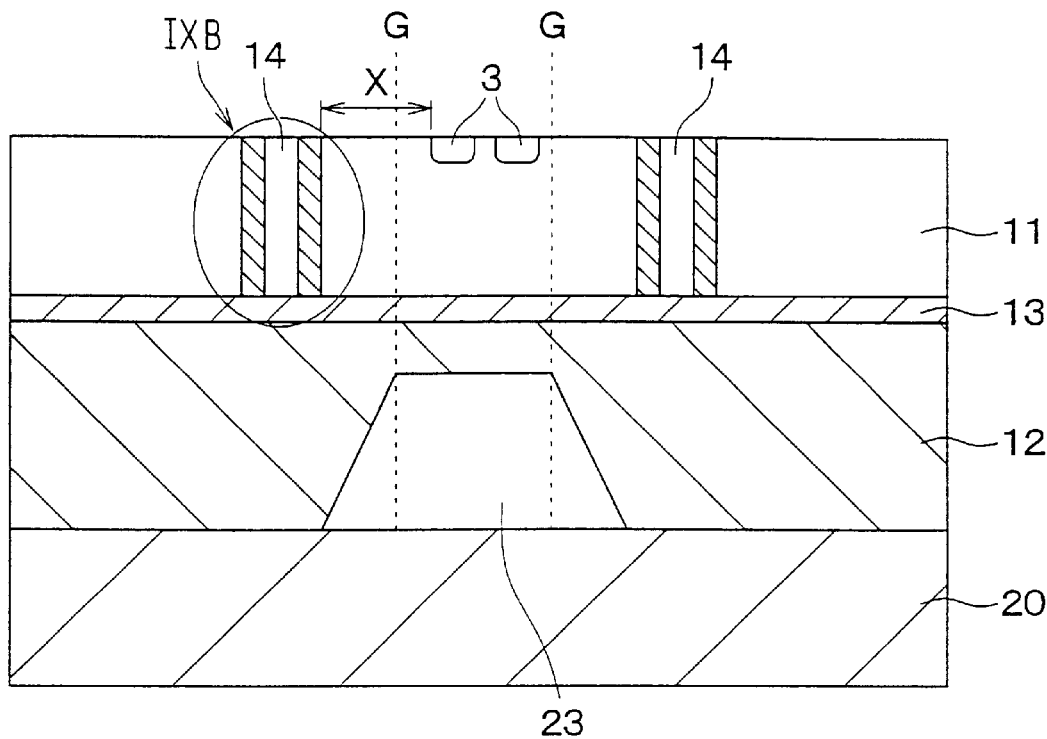
FIG. 9A is a cross-sectional view showing a model where relationships between trench positions, sensitivity and offset voltage are analyzed.
Figure 9B:
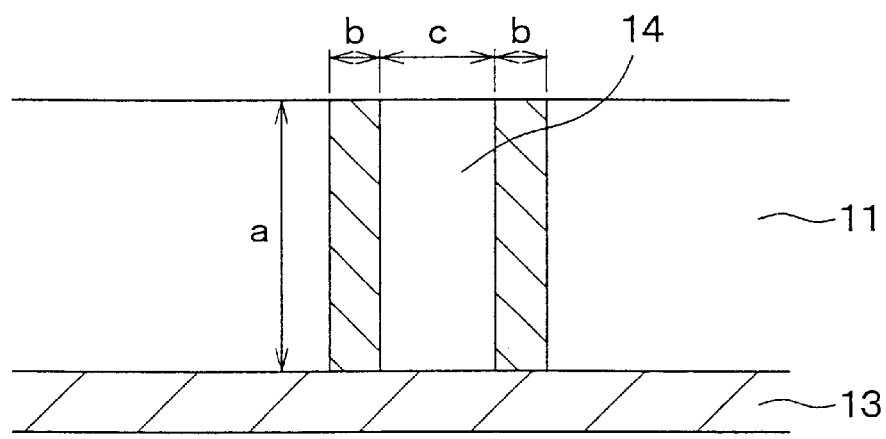
FIG. 9B is an enlarged view showing a portion encircled with arrow IXB in FIG. 9A.

Here, relationships between the position of the trench 14 and sensitivity and between the position of the trench 14 and offset voltage were studied by using a model shown in FIGS. 9A and 9B.

In the model, the trench 14 is provided by vertically etching silicon, and the sidewalls of the trench 14 are oxidized. Thereafter, polysilicon or oxide is embedded within the trench 14, and the surface is flattened at a CMP (Chemical Mechanical Polishing) process. Here, a depth "a" of the trench 14 is 15.1 $\mu$m, a thickness "b" of the oxide film on the sidewalls is 0.53 $\mu$m, and a width "c" of polysilicon or oxide embedded within the trench 14 is 2.1 $\mu$m (refer to FIG. 9B).

After the trench 14 is filled, substrate temperature is increased to 1000° C. Thereafter, the substrate temperature is returned to the room temperature (25° C.). Then, sensor characteristics (sensitivity, offset voltage) were evaluated as shown in FIGS. 10A and 10B.

Figure 10A:
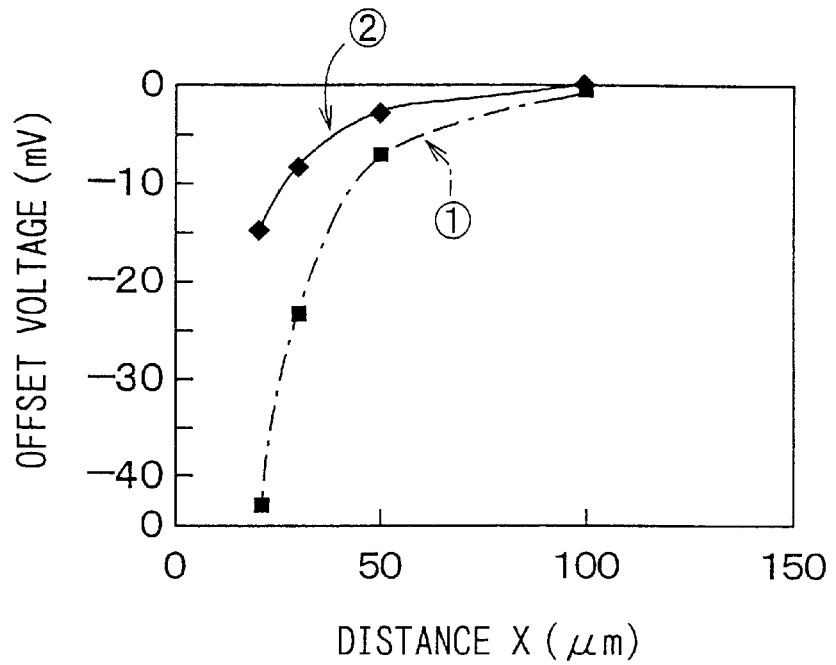
FIGS. 10A and 10B are graphs showing analyzed results of the model shown in FIGS. 9A and 9B.
Figure 10B:
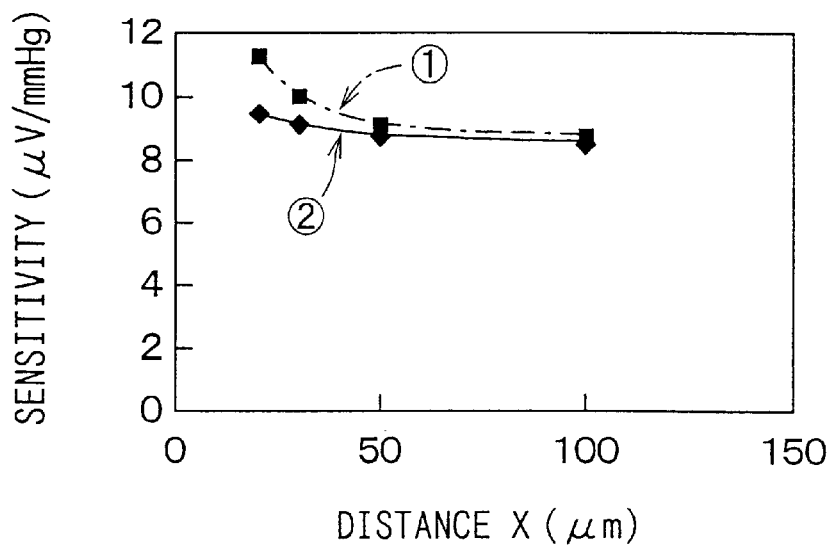

FIG. 10A shows a relationship between the offset voltage (mV) and distances X ($\mu$m) between the edge of the trench 14 and the strain gauges 3, and FIG. 10B shows a relationship between the sensitivity ($\mu$V/mmHg) and the distances X ($\mu$m). In FIGS. 10A and 10B, a graph curve indicated by ① shows a case where oxide (SiO$_2$) is embedded within the trench 14, and a graph curve indicated by ② shows a case where polysilicon is embedded within the trench 14.

As shown in FIGS. 10A and 10B, when the edge of the trench 14 and the strain gauges 3 are separated from each other at 50 $\mu$m or more, the sensitivity can be made stable, and the offset voltage can be also decreased drastically. Further, when polysilicon is embedded within the trench 14, because stress produced at the trench 14 is smaller than that when oxide is embedded within the trench 14, adverse effect of the trench 14 to the sensor characteristics is smaller.

Such changes and modifications are to be understood as being within the scope of the present invention as defined by the appended claims.

What is claimed is:

1. A semiconductor pressure sensor comprising:
    a semiconductor substrate including a first silicon substrate, a second silicon substrate, and an insulation film interposed between the first silicon substrate and the second silicon substrate, the second silicon substrate having a recess portion;
    a diaphragm portion formed by the first silicon substrate as a bottom of the recess portion to be deformed by a pressure;
    a strain gauge formed on the diaphragm portion for generating an electric signal in accordance with deformation of the diaphragm portion;
    a circuit portion for detecting the electric signal from the strain gauge, formed on the first silicon substrate at a portion other than the diaphragm portion; and
    a LOCOS film formed on a main surface of the first silicon substrate opposite to the second silicon substrate, the LOCOS film being located outside an outermost peripheral portion of and separated from a thin-wall portion of the diaphragm portion on the main surface of the first silicon substrate and electrically isolating the strain gauge from the circuit portion;
wherein:
    the diaphragm portion and the circuit portion are covered with a protection film formed on the main surface of the first silicon substrate, the protection film including at least two SiN system insulation films and an oxide film between the at least two SiN system insulation films.

2. A semiconductor pressure sensor comprising:
    a semiconductor substrate including a first silicon substrate, a second silicon substrate, and an insulation film interposed between the first silicon substrate and the second silicon substrate, the second silicon substrate having a recess portion;
    a diaphragm portion formed by the first silicon substrate as a bottom of the recess portion to be deformed by a pressure;
    a strain gauge formed on the diaphragm portion for generating an electric signal in accordance with deformation of the diaphragm portion;
    a circuit portion for detecting the electric signal from the strain gauge, formed on the first silicon substrate at a portion other than the diaphragm portion, and composed of a plurality of circuit elements isolated from each other by a trench that penetrates the first silicon substrate in a thickness direction to reach the insulation film; and
    a protection film formed on the first silicon substrate to cover the diaphragm portion and the circuit portion, and including at least two SiN system insulation films and an oxide film between the at least two SiN system insulation films.

* * * * *